April 2, 1957 W. SHOCKLEY 2,787,564

FORMING SEMICONDUCTIVE DEVICES BY IONIC BOMBARDMENT

Filed Oct. 28, 1954

INVENTOR
W. SHOCKLEY
BY
Arthur J. Torsiglieri
ATTORNEY

United States Patent Office 2,787,564

Patented Apr. 2, 1957

2,787,564

FORMING SEMICONDUCTIVE DEVICES BY IONIC BOMBARDMENT

William Shockley, Madison, N. J., assignor to Bell Telephone Laboratories, Incorporated, New York, N. Y., a corporation of New York Application October 28, 1954, Serial No. 465,393

4 Claims. (Cl. 148—1.5)

Figure 1:
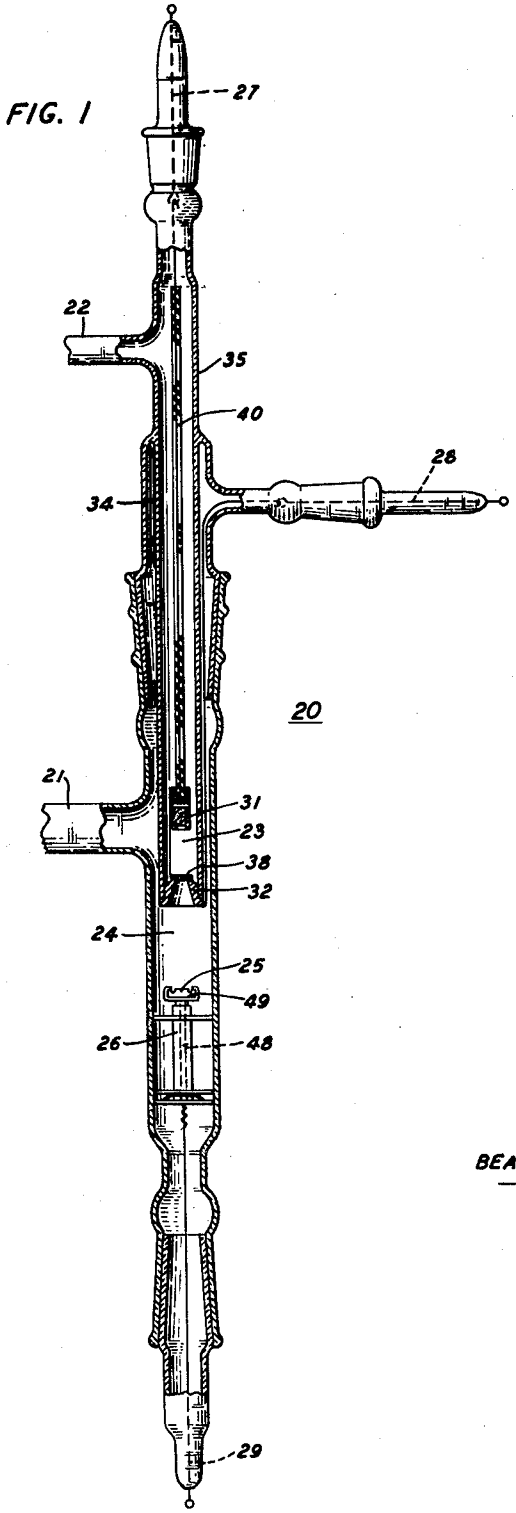

This invention relates to a process for manufacturing semiconductive devices, and to devices fabricated in accordance with this process.

An important form of semiconductive device for use in the amplification of applied signals comprises a semiconductive body which includes a base zone of one conductivity type intermediate between emitter and collector zones of opposite conductivity type. Such devices are now familiarly known as junction transistors. In such transistors, charge carriers of the sign which are in the minority in the base zone are injected therein from the emitter zone under the influence of applied signals. Such injected carriers diffuse across the base zone into the collector zone and modify the current flowing in the collector circuit whereby an amplified replica of the applied signal is there available.

The upper limit in the frequency of useful operation of a junction transistor is to a large degree fixed by the transit time of the injected carriers in diffusing across the base zone. This, in turn, is governed by the width or thickness of the base zone. Hitherto, considerable difficulty has been experienced in fabricating junction transistors with base zones sufficiently narrow to permit operation of frequencies up to or much beyond 50 megacycles.

One specific object of the present invention is to increase the upper frequency limit of operation of junction transistors by fabricating junction transistors with base zones of reduced thicknesses.

To this end, the present invention provides a process which is suited for fabricating junction transistors having extremely thin base zones and which makes possible the formation of interior zones a few angstroms in thickness. In accordance with this process, a semiconductive body of one conductivity type is bombarded with a monoenergetic beam of ions of a significant impurity element characteristic of a conductivity type opposite to that of the body in a manner to convert the conductivity type of a thin layer in the interior of the body.

A significant impurity is an element whose atoms will enter into the crystal structure of a semiconductive body replacing atoms of the semiconductor and bonding covalently with adjacent atoms of the characteristic diamond structure of the semiconductor in a manner that leaves either a positive or a negative charge carrier. For example, a boron atom, having three valence electrons, which is injected into the diamond structure of a germanium crystal will form electron pair bonds to three of the four adjacent germanium atoms. However, it fails to satisfy the bonding requirements of the fourth adjacent germanium atom, thereby leaving an electron deficiency or hole which can be made to function as a positive charge carrier. Such an impurity element is characterized as an acceptor. Alternatively, a phosphorous atom having five valence electrons can by similar considerations be shown to establish a negative charge carrier. Such an impurity element is characterized as a donor.

In the process of the invention, the energy level of the bombarding beam is adjusted so that the projected ions will penetrate into the interior of the semiconductive body and be localized there for converting that region to opposite conductivity type. By utilization of a monoenergetic beam, the ions are all made to penetrate to a fairly uniform depth whereby the thickness of the region of converted conductivity type is kept small. The thickness of this region can be controlled by variations in the energies of the bombarding ions. Thereafter, the semiconductive body is treated to repair the radiation damage done to the surface region penetrated. This is done advantageously by annealing at a temperature sufficiently low that there results little migration from the region of deposition of the significant impurity ions introduced by the bombardment. It is also characteristic of this technique that fine scale junctions of a predetermined geometry may be formed either in the interior or even on the surface of a semiconductive body. The junction may be formed in accordance with a preselected pattern either by the use of a deflection system which sweeps an ion beam focused to an appropriate cross section over the semiconductive body or else by interposing a suitable apertured mask between the ion source and the semiconductive body. In this latter technique, it is advantageous to employ a mask apertured on a scale considerably enlarged over the size of the junction pattern desired and thereafter to condense, in the manner familiar to workers in ion optics, the ions passing through the mask to reduce the scale of the pattern to that desired for the junction.

Accordingly, a broad object of the invention is to form fine scale junctions of a predetermined geometry in a semiconductive body.

The bombardment of a semiconductive body to effect a change in conductivity type of a gross surface portion of a semiconductive body has been suggested hitherto. Some of these suggestions have involved the simple rearrangement of the crystal lattice of the semiconductive body at the surface without the introduction of ions of a significant impurity in a manner that provided a change there of conductivity type. However, such changes will generally be undone by heat treatment.

In contradistinction, in the process of the present invention, bombardment with ions of a significant impurity is utilized to effect in the interior of the body a chemical change in the atomic structure of the crystal lattice, which after annealing will become relatively stable with temperature. Concomitant with this change, there also will usually result surface "damage" of the kind characteristic of the prior art bombardment technique but this damage is advantageously repaired in a succeeding step in the process of the invention.

In a copending application having the same assignee as the present application, Serial No. 141,152, filed January 31, 1950, by R. S. Ohl which issued on June 12, 1956 as United States Patent 2,750,411, it is suggested inter alia that bombardment with ions of a significant impurity can be used to effect a change in conductivity of a surface of a semiconductive body. In contradistinction, in the process of the present invention, the bombardment with significant impurity ions is advantageously used to effect a change in conductivity type of an interior region of a semiconductive body, and any change made in conductivity type of the surface by such bombardment is advantageously undone so that a zone of one conductivity type can be formed intermediate between two zones of opposite conductivity type.

In an illustrative embodiment of the invention, an N-type zone of a germanium body is bombarded with a beam of boron ions to form in the interior of the zone a P-type layer. Thereafter the body is annealed to repair any damage done to the bombarded surface of the body as a consequence of penetration by the beam.

In semiconductive bodies made in accordance with the general principles of the invention, it is relatively difficult to make ohmic contact to the extremely thin intermediate zone by conventional techniques, especially since the terminal zone corresponding to the penetrated surface is also extremely thin.

Moreover, it is difficult to achieve a uniform layer out to the very edge of the wafer. This necessitates lapping of the edges of the wafer which is undesirable especially at the edge to which the base connection is to be made.

To meet these problems, in a preferred embodiment of the invention the semiconductive wafer bombarded is one which initially has contiguous P- and N-type zones forming a junction therein. The wafer is positioned for penetration by the beam in a direction parallel to the junction to divide a first of the two zones by a thin layer of the same conductivity type as the second of the two zones and extending continuously therefrom. Thereafter, ohmic contact to the second of the two zones functions as ohmic contact to the thin intermediate zone formed in the first of the two zones. Moreover, there is now avoided the problem of edge effects at the edge to which the base connection is to be made since the bombarded layer can be extended uniformly into the second zone without any significant effect.

Figure 2A:
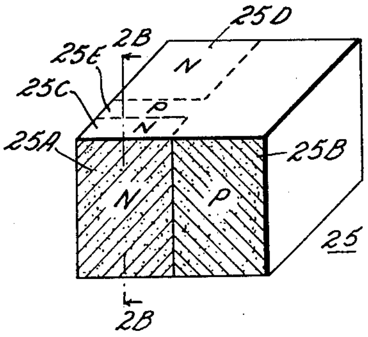
Figure 2B:
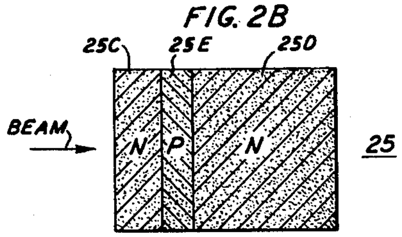

The invention will be more fully understood from the following more detailed description of the preferred embodiment taken in conjunction with the accompanying drawings, in which:

Fig. 1 shows schematically an illustrative arrangement for bombarding a semiconductive body with a beam of ions for effecting a change in conductivity type of an interior layer of the body in accordance with the invention; and Figs. 2A and 2B show perspective and sectional views of an N-P-N semiconductive body processed in accordance with the invention.

By way of illustration there will be described schematically a simple one of the many possible alternatives for forming a monoenergetic ion beam of high velocity for use in bombarding. Often it may be desirable to resort to more complex arrangements of the kind familiar to workers in nuclear physics.

With reference now more particularly to the drawings, the specific arrangement shown in Fig. 1 is directed to the bombardment of a germanium wafer with boron ions. A closed envelope 20 is evacuated through a tubing 21 by a vacuum pump. The envelope includes an ion chamber 23 which serves as an ion gun, a bombardment chamber 24, a work holder 26 to support the germanium wafer 25 to be bombarded in the bombardment chamber, and lead-in conductors 27, 28 and 29 by means of which potentials are applied to the anode 31, cathode 32 of the ion gun, and to the work holder 26, respectively. The germanium wafer 25 to be bombarded is shown in Fig. 2A as seen when viewed from the source of the bombarding beam. As shown, its front face includes contiguous zones 25A and 25B of opposite conductivity types.

Ion chamber 23 is formed by the reentrant tube 34, extending from the top section 35 of the envelope 20 and closed off by the cathode 32. The cathode 32 is provided with leakage holes to permit the ions produced in the ion chamber 23 to pass into the bombardment chamber 24. A wire 40 secured to lead-in conductor 27 provides an electrical connection and a mechanical support for the anode 31 which is suspended in the ion chamber 23.

Controlled atmospheres are achieved in the ion chamber by first evacuating the envelope 20 through tubing 21 and thereby the ion chamber, and then admitting controlled amounts of boron trifluoride vapor through the tube 22 into the ion chamber. The pressure in the ion chamber is controlled by continued pumping by way of tubing 21. The pressure in the bombarding chamber is kept considerably lower than that in the ion chamber.

The work holder 26 is supported in the bombarding chamber aligned with the holes 38 in the cathode 32 which forms an end wall of the ion chamber 25, whereby ions escaping from the ion chamber are projected towards the exposed surface of the germanium wafer mounted in the holder. The holder is held in its proper position by suitable insulating supports.

An electric field is set up between the wafer to be bombarded and the cathode of the ion gun in order to accelerate the ions which pass through the cathode holes towards the germanium wafer. This is achieved by providing the work holder with an axial conductor 48 which extends from a conductive base portion 49 with which the wafer makes electrical contact.

Provision is made advantageously by the insertion of a deflection system (not shown) intermediate between the cathode and the work holder along the path of ion flow for sweeping the ion beam along the face of the germanium wafer whereby the original N-type zone 25A is divided by a P-type zone 25E into two distinct N-type zones 25C and 25D, as shown in Fig. 2A. Alternatively, provision can be made for moving the wafer across the path of a fixed ion beam. In Fig. 2B, there is shown a section taken along the line B—B in Fig. 2A of the end result sought. As there seen, the N-type zone 25A has been divided into two N-type zones 25C and 25D by the intermediate P-type zone 25E which forms an extension of P-type zone 25B as can be seen from Fig. 2A.

The germanium wafer to be bombarded preferably is first polished to eliminate any surface irregularities and then thoroughly cleaned. After cleaning, it is mounted on the work holder, and the envelope 20 is sealed and evacuated. Boron trifluoride vapor is then admitted through tubing 22 into the ion chamber. An ion arc between the cathode 32 and the anode 31 is then struck by the application of a suitably large D. C. potential therebetween, and after an arc is established, the bombarding current is fixed by suitable adjustment of the gas flow and the arc voltage to yield the desired bombarding current. When the bombardment period is completed, the arc is broken by removing the potential applied between the cathode and the anode.

The escaping ions are accelerated to appropriate high velocities by the potential applied between the semiconductive wafer and the cathode 32 in the ion chamber. To secure adequate penetration into the interior of the wafer, high accelerating fields should be provided. In general, it should be advantageous to operate with accelerating potentials of tens of thousands of volts. The accelerating potential utilized determines the depth of penetration of the ions. By varying the accelerating potential variations in the depth of penetration may be achieved. This makes possible control of the thickness of the layer of changed conductivity type. The bombardment interval and bombarding current determine the number of boron ions injected into the wafer. This is made sufficiently large to convert the conductivity type of a suitable layer in the wafer so as to provide a highly doped P-type intermediate zone.

It will also be the case that the use of boron trifluoride vapor in the ion chamber ordinarily will result, in addition to boron ions, in ions of various compounds of boron and fluorine. In the usual case, such complex ions should little affect the conductivity of the bombarded wafer. In particular, such heavier ions should penetrate not as far into the interior of the wafer as the lighter boron ions. In cases where it is found that such other ions do affect undesirably the characteristics of the bombarded wafer, they may be separated out by the techniques usual in mass spectroscopy for separating ions of different masses. Moreover, it is also possible that there will be formed boron ions of different charges, corresponding to the removal of different number of electrons from the atom. Boron ions of different charges will have different velocities after acceleration which results in different levels of penetration. The ions of highest charge will be accelerated most and penetrate deepest. Where it is advantageous to operate with as low an accelerating potential as possible, it is preferable to use for bombardment ions of highest charge provided they be in sufficient numbers. In order to achieve an ion beam which is substantially mono-energetic for uniform penetration, the ions of charges other than those suitable for the desired bombardment may be separated out by techniques familiar to workers in the mass spectroscopy art.

After the germanium wafer has been bombarded for a suitable time so that a region of its interior has been converted from N- to P-type conductivity by the added concentration of boron atoms, it is usually desirable to repair the damage done to the surface of the wafer by the ion penetration. Such damage may be conveniently repaired simply by heating the wafer under appropriate conditions. Such heating also tends to stabilize the newly formed interior zone. The heating temperature preferably should be sufficiently low that inappreciable thermal migration of the injected boron atoms occurs. A temperature of 400° C. is typical. The heating interval should be sufficiently long that substantially all of the damage is repaired. An interval of ten minutes should usually be sufficient. It is evident that the optimum annealing conditions in a particular case will be fixed by the bombarding conditions, since these determine the amount of damage done which must be repaired.

The choice of ions of boron for bombarding is advantageous from several considerations. Boron has a light atom which should penetrate into the interior of the wafer of heavier germanium atoms relatively easily. It migrates inappreciably in germanium except at rather high temperatures. Additionally, it acts readily as a significant impurity in germanium.

It is of course feasible to select ions of other significant impurity elements for use in bombarding, such as of lithium and aluminum. Additionally, wafers of other semiconductive material, such as silicon, germanium-silicon alloys, and semiconductive compounds of group III–group V elements of the periodic table (e. g., indium antimonide) may be bombarded to the same end. Similarly various other forms of ion sources may be employed, such as a spark ion source. Moreover, the vapor of a solid such as arsenic may be ionized to supply the bombarding ions rather than a gaseous compound.

After the preparation of the semiconductive body has been completed, it is necessary to provide electrical contacts to the various zones for transistor operation. Such contacts can be made simply by well known plating techniques. In particular, electrodes can be provided to zones 25C and 25D to serve as the emitter and collector electrodes, and an electrode can be provided to the zone 25B for use as the base electrode.

It is to be understood that the specific embodiment described is illustrative of the general principles of the invention. Various modifications may be devised by one skilled in the art without departing from the spirit and scope of the invention. For example, by bombardment of a P-type zone of a semi-conductive body with ions of a donor impurity, a P-N-P structure can be formed. Additionally, for example, by the bombardment of the N zone of a P-N-P wafer to form therein a thin intermediate P-type zone which extends between the two terminal P-type zones, there is formed a semiconductive body advantageous for use in tetrode operation in the manner described in an article entitled "A junction transistor tetrode for high-frequency use" published in the Proceedings of the I. R. E., vol. 40, pp. 1395–1400 (1952). In this instance, electrode connections made to the two surfaces of the N-type zone serve as the emitter and collector electrodes and electrode connections to the two terminal P-type zones as the two base electrodes.

What is claimed is:

1. The method of treating a body of a semiconductor taken from the group consisting of germanium, silicon, germanium-silicon alloys, and the semiconductive compounds of groups III–V elements of the periodic table, which comprises the steps of bombarding a predetermined area of the semiconductive body with a beam of ions of a significant impurity element characteristic of the conductivity type opposite that of the body for a time and with a penetration energy to form only in the interior of the semiconductive body a zone of the opposite conductivity type, and annealing the body to repair the surface damage done to the body by the penetration of the bombarding beam.

2. The method of preparing a device of a semi-conductor taken from the group consisting of germanium, silicon, germanium-silicon alloys, and semiconductive compounds of groups III–V elements of the periodic table, which comprises the steps of bombarding a predetermined area of a body of said semiconductor having contiguous first and second zones of opposite conductivity type with a beam of ions of a significant impurity characteristic of the conductivity type of said second zone for a time and with a penetration energy to form in the interior of said first zone and extending from said second zone a layer of the conductivity type of said second zone intermediate between two portions retaining the conductivity type of the first zone, and annealing the body to repair the surface damage done to the body without any significant migration of the ions introduced by the bombardment.

3. The method of preparing for use in a tetrode junction transistor a body of a semiconductor taken from the group consisting of germanium, silicon, germanium-silicon alloys, and semiconductive compounds of groups III–V elements of the periodic table, comprising the steps of bombarding a predetermined area of a body of said semiconductor which includes two terminal zones of one conductivity type spaced by an intermediate zone of the opposite conductivity type with a beam of ions of a significant impurity characteristic of said one conductivity type for a time and with a penetration energy for forming in the interior of said intermediate zone a region of said one conductivity type extending between said two terminal zones of said one conductivity type, and annealing the body to repair the surface damage done by the bombarding beam.

4. In a semiconductive device, a body of a semiconductor taken from the group consisting of germanium, silicon, germanium-silicon alloys, and semiconductive compounds of groups III–V elements of the periodic table, comprising first and second zones of the same conductivity type and a third zone of the opposite conductivity type including a portion which extends intermediate between and separates said first and second zones and which has been formed by bombarding a predetermined area of a semiconductive body with a beam of ions of significant impurity element characteristic of the conductivity type of the third zone for a time and with a sufficient penetration energy to form an extension of said third zone intermediate between said first and second zones.

References Cited in the file of this patent

UNITED STATES PATENTS

| | | |
|---|---|---|
| 2,563,503 | Wallace | Aug. 7, 1951 |
| 2,588,254 | Lark-Horovitz et al. | Mar. 4, 1952 |
| 2,597,028 | Pfann | May 20, 1952 |
| 2,703,855 | Koch et al. | Mar. 8, 1955 |

FOREIGN PATENTS

| | | |
|---|---|---|
| 133,885 | Sweden | Dec. 11, 1951 |
| 695,178 | Great Britain | Aug. 5, 1953 |
| 1,071,730 | France | Mar. 10, 1954 |